United States Patent [19]

Matsumoto et al.

[11] Patent Number: 4,982,370
[45] Date of Patent: Jan. 1, 1991

[54] SHARED SENSE AMPLIFIER SEMICONDUCTOR MEMORY

[75] Inventors: Noriaki Matsumoto; Toshifumi Kobayashi; Koichiro Mashiko, all of Itami, Japan

[73] Assignee: Mitsubishi Denki Kabushiki Kaisha, Japan

[21] Appl. No.: 357,621

[22] Filed: May 23, 1989

Related U.S. Application Data

[63] Continuation of Ser. No. 886,725, Jul. 18, 1986, abandoned.

[30] Foreign Application Priority Data

Oct. 4, 1985 [JP] Japan ............................ 60-222102

[51] Int. Cl.$^5$ ................................................ G11C 7/00
[52] U.S. Cl. ........................................ 365/222; 365/205; 365/210
[58] Field of Search ............... 365/149, 205, 207, 208, 365/210, 222

[56] References Cited

U.S. PATENT DOCUMENTS

| | | | |
|---|---|---|---|
| 4,351,034 | 9/1982 | Eaton, Jr. et al. | 365/205 |
| 4,578,782 | 3/1986 | Kraft et al. | 365/222 |
| 4,598,387 | 7/1986 | Chuang et al. | 365/149 |
| 4,606,010 | 8/1986 | Saito | 365/189 |
| 4,628,488 | 12/1986 | Saku et al. | 365/222 |
| 4,710,901 | 12/1987 | Kumanoya et al. | 365/205 |

OTHER PUBLICATIONS

1984 IEEE International Solid-State Circuits Conference, Feb. 24, 1984, pp. 278-279.
Eaton et al., "Circuit Advances Propel 64-K RAM Across the 100-ns Barrier", Electronics, Mar. 24, 1982, at 132.

Primary Examiner—James W. Moffitt
Attorney, Agent, or Firm—Saidman, Sterne, Kessler & Goldstein

[57] ABSTRACT

In a dynamic random access semiconductor memory device comprising a sense amplifier and two pairs of bit lines sharing the sense amplifiers, each of the bit lines having a plurality of memory cells connected thereto, when a memory cell connected to one of the bit-line pairs is selected, the memory cells connected to the other bit-line pair are not connected to the sense amplifier, and, during a refresh cycle for rewriting data into a selected memory cell connected to a bit line of one of the bit-line pairs, the bit lines of the other bit-line pair are disconnected from the sense amplifier.

40 Claims, 4 Drawing Sheets

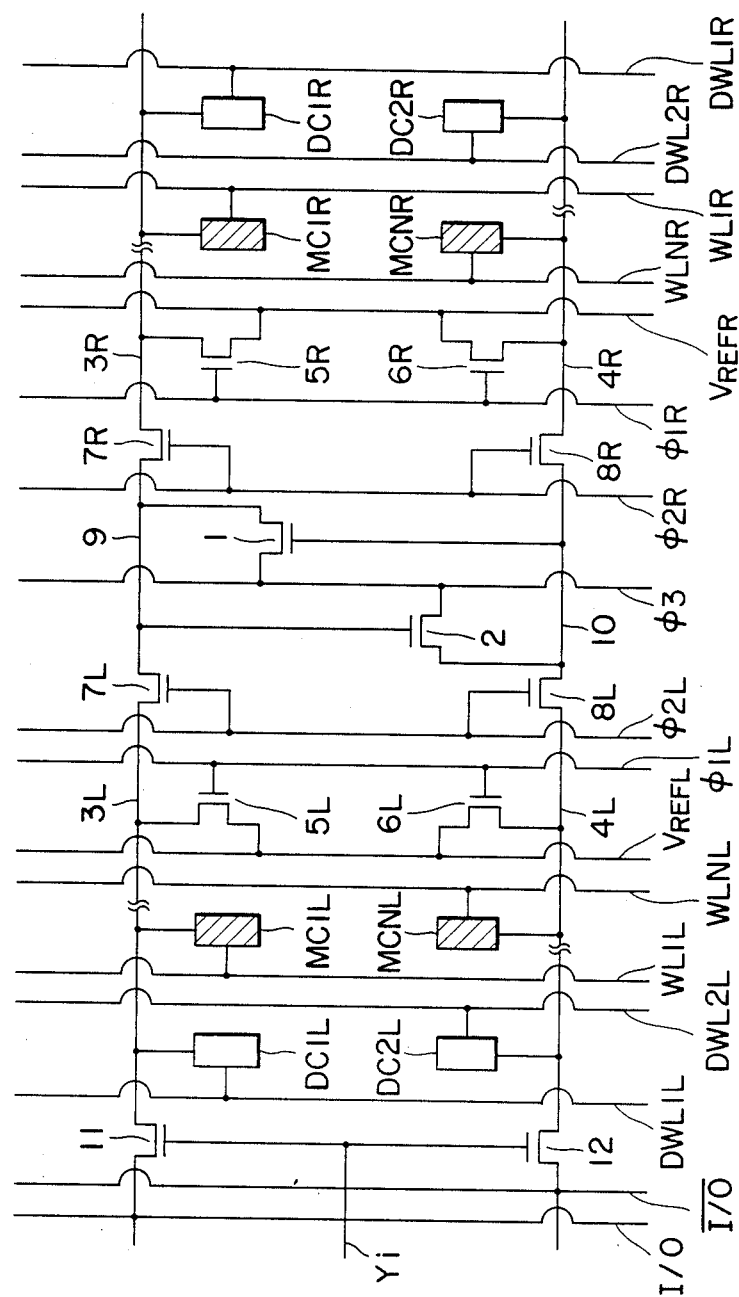
F I G. 2

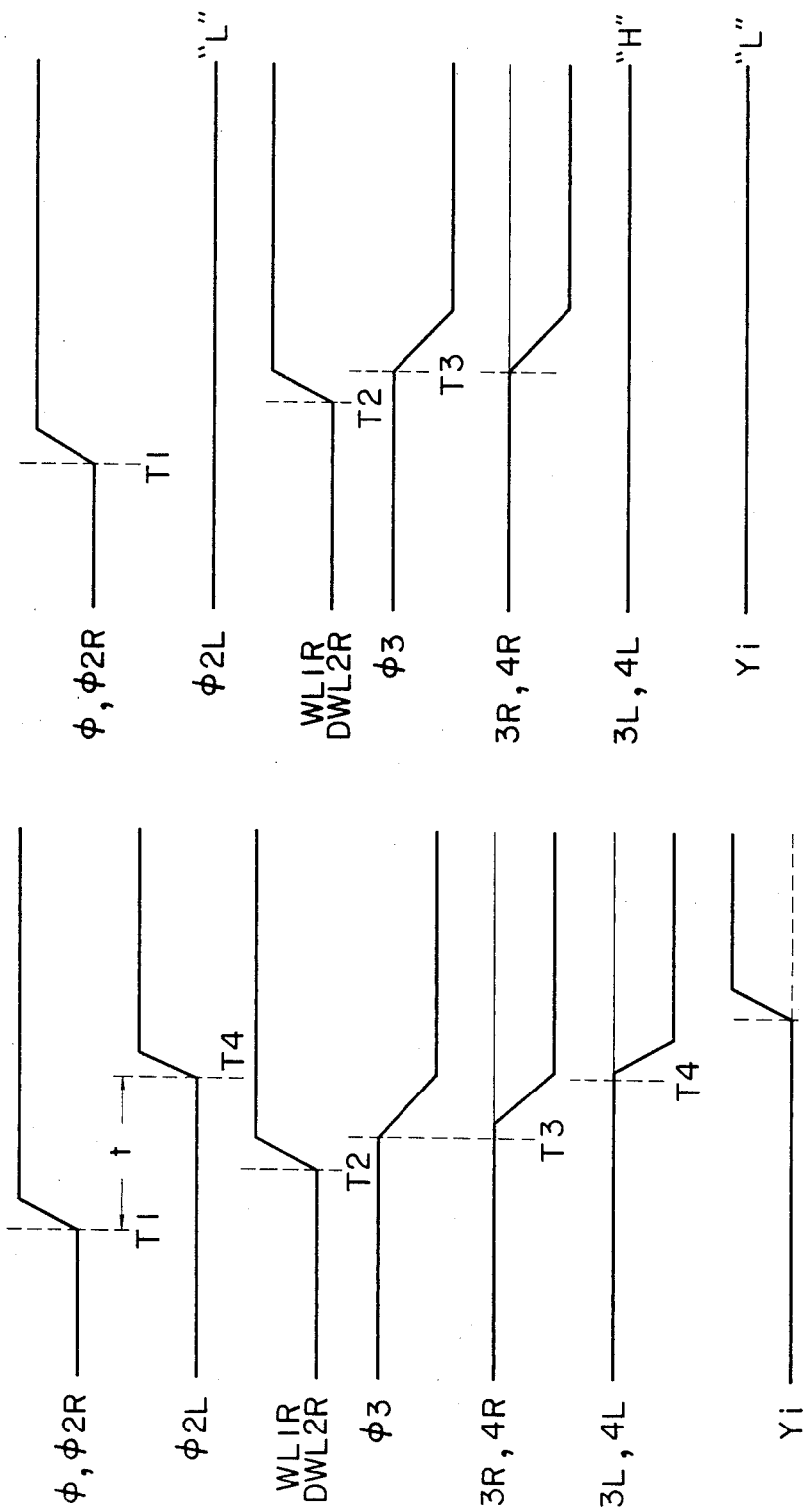

SHARED SENSE AMPLIFIER SEMICONDUCTOR MEMORY

This application is a continuation of application Ser. No. 06/886,725, filed Jul. 18, 1986, now abandoned.

BACKGROUND OF THE INVENTION

The present invention relates to a shared sense amplifier semiconductor memory device consisting of a dynamic random access memory which typically has storage elements or memory cells arranged in rows and columns to form a matrix. Each of the storage elements may comprise a MOS transistor and a storage capacitor.

A conventional semiconductor memory device of this type, such as that shown in Japanese Laid-Open Patent Application No. 82286/1982, comprises at least two arrays (a right array, and a left array), each having folded bit lines extending parallel with each other. Flip-flop sense amplifiers are arranged in a row between the arrays and are shared between the arrays. That is, each sense amplifier has a pair of sense nodes connected to a respective one of bit-line pairs of each of the two arrays through transfer transistors. There is a provision that the two arrays are not selected simultaneously. Sharing the sense amplifiers reduces the total number of sense amplifiers, and hence the chip area can be reduced. Moreover, because of the shorter bit lines, the sensitivity of the sense amplifier is effectively increased. However, the prior art memory device has a limitation in that an irreducible minimum amount of power is dissipated; this amount of wasted power cannot be made small enough for certain applications. This power loss is due to charging and discharging currents which flow through the bit lines of the array of the unselected side during the refresh cycle.

SUMMARY OF THE INVENTION

An object of the invention is to reduce the power dissipation in a dynamic random-access memory.

According to the invention, the bit lines of the unseleccted array are disconnected from the sense amplifier during the refresh cycle.

BRIEF DESCRIPTION OF THE DRAWINGS

In the accompanying drawings:
FIGS. 2 and 3 are circuit diagrams showing a part of the memory device according to the invention;
FIGS. 5 and 6 are clock timing charts showing operation of the memory device.

DETAILED DESCRIPTION OF THE PREFERRED EMBODIMENTS

Figure 1:
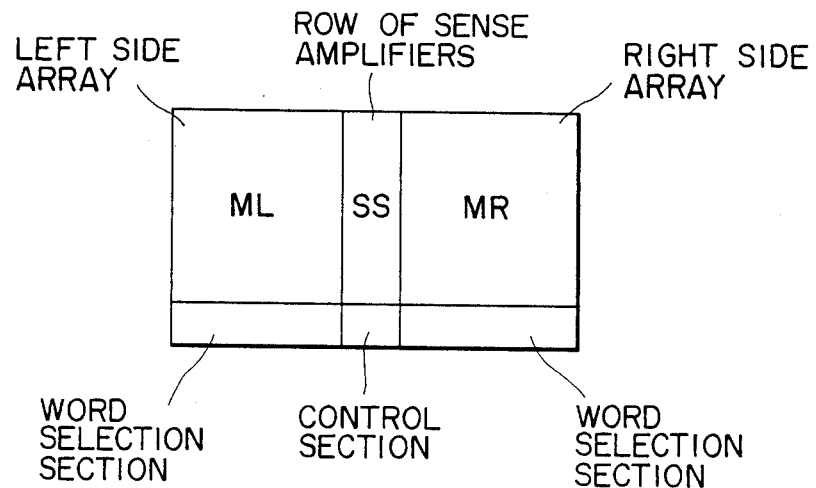
FIG. 1 is a schematic diagram showing an embodiment of the memory device according to the invention.
Figure 3:
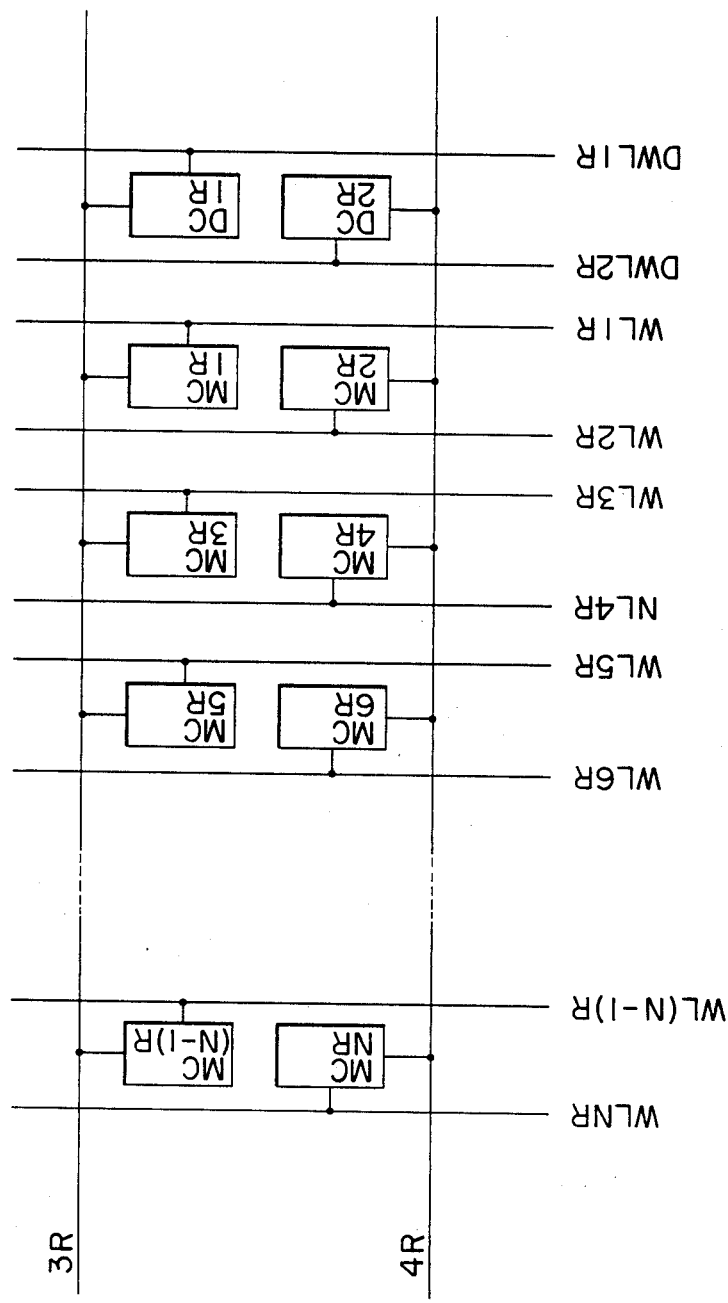

As shown in FIG. 1, an embodiment of the memory device according to the invention comprises two arrays MR and ML of memory cells (the right side and the left side as viewed in FIG. 1), and a row of flip-flop sense amplifiers SS located between and shared by the two arrays. FIG. 2 shows a part of such a memory device, namely one sense amplifier and the bit lines coupled to the sense amplifier. FIG. 3 shows, in further detail, how the memory cells and dummy memory cells of the right side array are connected. The sense amplifier comprises NMOS transistors 1 and 2 cross-coupled to each other to form a flip-flop circuit having sense nodes or input-/output nodes 9 and 10 at which complementary outputs of the flip-flop circuit are provided when the sense amplifier is enabled. More specifically, as illustrated in FIG. 2, the transistors 1 and 2 have their sources connected together, and each of the transistors 1 and 2 has its gate connected to the drain of the other transistor. The drains of the transistors form the sense nodes of the sense amplifier. A control line is connected to the sources of the transistors 1 and 2 receives a clock signal $\phi 3$ for selectively enabling and disabling the sense amplfiier. The M memory cells, transistors 1 and 2, and the control line are shared by two pairs of bit lines 3R, 4R, 3L and 4L. The bit lines 3R and 4R extend within the right side array while the bit lines 3L and 4L extend within the left side array.

Single memory cells MCIL, . . . MCNL, MCIR . . . MCNR are shown connected to the bit lines 3R, 4R, 3L and 4L of FIG. 2. FIG. 3 shows how cells MC1R, MC3R, MC5R, . . . MC(N−1)R are connected to the bit line 3R, and memory cells MC2R, MC4R, MC6R, . . . MCNR are connected to the bit line 4R. A like number of memory cells MC3L, MC3L, MC5L, . . . MC(N−1)L (only one (MC1L) of them being depicted) are similarly connected to the bit 3L, and memory cells MC2L, MC4L, MC6L, . . . MCNL (only one (MCNL) of them being depicted in FIG. 2) are similarly connected to the bit line 4L. Thus, the same number (N/2) of memory cells are connected to the bit lines of each pair. It is here noted the N is an even number. It is also noted that the suffixes R and L represent the "right side" and the "left side" as seen in the figure. Each memory cell may comprise a storage capacitor and a corresponding MOS transistor linking the storage capacitor to the corresponding bit line.

When one of word lines WL1R . . . WLNR (see FIG. 3) is selected, the data stored in the corresponding memory cell MC1R . . . MCNR is read out into the corresponding bit line, 3R when N is odd, 4R when N is even. Dummy memory cells DC1R and DC2R (shown in FIGS. 2 and 3) are controlled by signals on dummy word lines DWL1R and DWL2R and provide a potential intermediate between the high and the low levels, onto the bit lines 3R and 4R. The memory cells MC1L . . . MCNL and dummy memory cells DC1L and DC2L of the left side array operate in a similar manner. It is however noted that the right side array and the left side array are not selected simultaneously. While the potentials of the word lines and dummy word lines of the selected side rise, the word lines and the dummy word lines of the unselected side are kept at the low level. That is, if for example the memory cells of the right side array are selected, the potentials of the word lines and the dummy word lines of the right side array are raised, while the word lines and the dummy word lines of the left side array are kept at the low level.

NMOS transistors 5R and 6R have their sources connected to the bit lines 3R and 4R, their gates connected to receive precharge clock $\phi 1R$, and their drains connected to a precharge potential $V_{REFR}$. The transistors 5R and 6R serve to precharge the bit lines 3R and 4R to the precharge potential $V_{REFR}$. NMOS transistors 5L and 6L of the left side array are similarly connected and have similar functions.

The sense node 9 is connected to the drain of the transistor 1 and the gate of the transistor 2, and is connected through transfer transistors 7R and 7L to the bit lines 3R and 3L, respectively. Similarly, the sense node 10 is connected to the drain of the transistor 2 and the gate of the transistor 1, and is also connected through transfer transistors 8R and 8L to the bit lines 4R and 4L, respectively. The transfer transistors 7R, 8R, 7L and 8L are NMOS transistors and have their gates connected to receive signals clock $\phi 2R$, $\phi 2L$.

Althrough only one sense amplifier and two pairs of bit lines are depicted in FIG. 2, there are actually a plurality of sense amplifiers aligned vertically as seen in FIG. 3 and corresponding pairs of bit lines to form the right and left arrays of memory cells.

Input-output lines I/O and $\overline{I/O}$ are connected through transistors 11 and 12 and are used for outputting the potentials appearing on the bit lines 3R, 4R, 3L and 4L and for inputting data from outside onto the bit lines. The transistors 11 and 12 are controlled by a clock signals Yi. During a read cycle, the clock signal Yi rises at a time point when the data read out of the memory cell has been amplified by the sense amplifier, thereby to enable the amplified data to be transferred to the input-/output lines. During a write cycle, the clock signal Yi rises to turn on the transistors 11 and 12 to transfer the data on the input/output lines to the bit lines. During a refresh cycle, the clock signal Yi is kept at the low level, since no input/output is required for refreshing.

Figure 4:
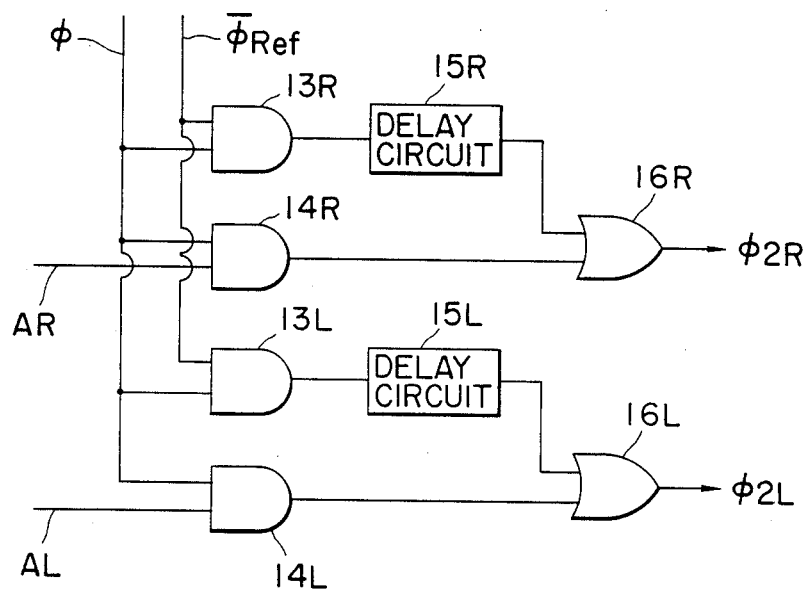
FIG. 4 is a circuit diagram of the sense amplifier control circuit.

Referring now to FIG. 4, the sense amplifier control circuit comprises AND gates 13R, 13L, 14R and 14L, delay circuits 15R and 15L, and OR gates 16R and 16L. The clock signals $\phi 2R$ and $\phi 2L$ which are generated in this circuit are used to control transfer transistors 7R, 8R, 7L and 8L as described above, and are derived from a clock signal $\phi$. A select signal AR is at the high level when any of the right side memory cells is to be selected. A select signal AL is at the high level when any of the left side memory cells is selected. A signal $\overline{\phi Ref}$ is at the high level during the read and write cycles, and is at the low level during the refresh cycle.

AND gates 13R and 13L receive the signal $\overline{\phi Ref}$ as well as the clock signal $\phi$. The delay circuits 15R and 15L receive outputs of the AND gates 13R and 13L. The OR gates 16R and 16L receive the outputs of the delay circuits 15R and 15L and the AND gates 14R and 14L. The outputs $\phi 2R$ and $\phi 2L$ of the OR gates 16R and 16L are fed to the gates of the transfer transistors 7R, 8R, 7L and 8L.

FIG. 5 shows operation of the circuit during a reading operation. It is assumed that a memory cell of the right side array is selected, so that signal AR is at the high level. During the read cycle, the signal $\overline{\phi Ref}$ is at the high level. It is also assumed that before a time T1, at which the reading operations begins the bit lines 3R, 4R, 3L and 4L have been precharged to precharge potentials $V_{REFR}$ and $V_{REFL}$, respectively.

At T1, a clock signal $\phi$ rises to the high level. Since AR is already high, the output of the AND gate 14R rises to the high level. The output $\phi 2R$ of the OR gate 16R then rises to the high level, so that the transfer transistors 7R and 8R become conductive.

Then, one of the word lines WL1R through WLNR and one of the dummy word lines DWL1R and DWL2R are selected, and their potentials rise, while the word lines WL1L through WLNL and the dummy word lines DWL1L and DWL2L of the unselected left side array are kept at the low level. The word line and the dummy word line which are selected simultaneously in the reading operation are connected to the opposite bit lines of the bit-line pair. In other words, when a word line associated with a memory cell connected to one bit line of the bit-line pair is selected, the dummy memory cell connected to the other bit line of the bit-line pair is selected simultaneously. For example, if the memory cell MC1R (which is connected to bit line 3R) is selected by word line WL1R, then the dummy cell DC2R (which is connected to bit line 4R) is selected by dummy word line DWL2R.

At T2, the potentials of the selected word line WL1R and the selected dummy word line DWL2R rise so that the data stored in the memory cell MC1R is read out onto the bit line 3R, and the charge stored in the dummy memory cell DC2R is read out onto the bit line 4R. The data read out are transferred through transfer transistors 7R and 8R to the sense nodes 9 and 10.

At T3, the clock $\phi 3$ drops to the low level, so that the sense amplifier is enabled. The data transferred to the sense nodes 9 and 10 is then amplified and fed back through the transfer transistors 7R and 8R to the bit lines 3R and 4R, and the amplified data is rewritten into the selected memory cell MC1R.

Upon expiration of the delay time t of the delay circuit 15L, its output is fed through the AND gate 13L, which is being open because $\overline{\phi Ref}$ is high, the clock $\phi 2L$ at the output of the OR gate 16L rises to the high level. This defines T4. The amplified data is transferred through the transfer transistors 7L and 8L to the bit lines 3L and 4L.

The signal Yi rises to the high level at T5, and the data to be read out is transferred through transistor 11 and 12 to the input-output lines. Thus, reading and rewriting (restoring) operations are completed.

The operations which take place when the memory cell and the dummy memory cell of the left side array are selected are similar to those described above, except that the references to the right and the left arrays R and L are reversed. FIG. 6 shows operations during a refresh cycle. In this case, $\overline{\phi Ref}$ remains at a low level. Here again, it is assumed that the memory cell MC1R and the dummy memory cell DC2R of the right side array is selected.

At T1, $\phi$ rises to the high level, and the select signal AR is at the high level, so that the output of the AND gate 14R also rises to the high level, and hence the output $\phi 2R$ of the OR gate 16R also rises to the high level. Transfer transistors 7R and 8R then become conductive.

At T2, the potentials of a selected word line, e.g. WL1R, and a selected dummy word line, e.g. DWL2R, rise and the data stored in the memory cell MC1R is read out onto the bit line 3R and the charge stored in the dummy memory cell DC2R is read out onto the bit line 4R. The data read out is transferred through transfer transistors 7R and 8R to the sense nodes 9 and 10.

At T3, the clock $\phi 3$ drops to the low level, so that the sense amplifier is enabled. The data transferred to the sense nodes 9 and 10 is amplified and fed back through the transfer transistors 7R and 8R to the bit lines 3R and 4R, and the amplified data is written into the selected memroy cell MC1R. Thus, refreshing is completed.

During such a refresh operation, the signal $\overline{\phi Ref}$ is kept at the low level, so that the output of the AND gate 13L and hence the output $\phi 2L$ of the OR gate 16L are kept at the low level. The transfer transistors 7L and 8L are therefore kept OFF. Thus, the sense amplifier is kept disconnected from the bit lines 3L and 4L of the left side array, so that the bit lines 3L and 4L are kept at the high level. The charging and discharging currents of the bit lines are therefore substantially reduced, so that dissipation of power is substantially reduced.

The operations which take place when a memory cell of the left side array is selected for refresh are similar to those described above except that the references to the right R and the left L are reversed.

The invention is applicable where refresh is accomplished by what is known as $\overline{CAS}$ before $\overline{RAS}$ (column-before row-address strobe) refresh, or by auto refresh by means of externally supplied control signals.

The invention is not limited to memory devices comprising NMOS transistors, but is also applicable to memory devices comprising PMOS transistors and memory devices comprising CMOS transistors.

What is claimed is:

1. A dynamic random access semiconductor memory device comprising:
    a sense amplifier, and first and second pairs of bit-lines sharing said sense amplifier, each pair of said bit-lines having a plurality of memory cells connected thereto;
    refresh/read logic means coupled to said bit-line pairs and having a plurality of operating cycles comprising refresh cycles, and read cycles, said logic means including means for generating control signals for controlling connections between said bit-line pairs and said sense amplifier;
    wherein:
        in one of said refresh cycles, in which a memory cell is connected to one of said bit-line pairs, said control signal generating means generates control signals to control a first connection of said one bit-line pair to said sense amplifier and a first disconnection of the other bit-line pair from said sense amplifier throughout said one refresh cycle;
        in a second one of said refresh cycles, in which a memory cell is connected to a second bit-line pair, said control signal generating means generates control signals to control a second connection of said second bit-line pair to said sense amplifier and a second disconnection of said one bit-line from said sense amplifier throughout said second refresh cycle; and
        in one of said read cycles, in which data may be rewritten into a memory cell connected to said one of said bit-line pairs, said control signals control the connection of said one bit-line pair to said sense amplifier, and control the connection of said second bit-line pair to said sense amplifier after said one bit-line pair is connected to said sense amplifier; and
        in a second read cycle, in which data may be rewritten into a memory cell connected to said second bit-line pair, said control signals control a disconnection of said one bit-line pair from said sense amplifier and the connection of the second bit-line pair to said sense amplifier.

2. A dynamic random access semiconductor memory device comprising:
    a sense amplifier, and two pairs of bit-lines sharing said sense amplifier, each pair of said bit-lines having a plurality of memory cells connected thereto; and
    refresh logic means coupled to said bit-line pairs and having a plurality of operating cycles comprising refresh cycles, said logic means including means for generating control signals for controlling the connections between said bit-line pairs and said sense amplifier;
    wherein during said refresh cycles data may be rewritten into a memory cell connected to one of said bit-line pairs, and said control signal generating means generates control signals to control the connection of said one bit-line pair to said sense amplifier and a disconnection of the other bit-line pair from said sense amplifier throughout said refresh cycles.

3. A dynamic random access semiconductor memory device comprising:
    at least two arrays, each comprising a plurality of memory cells each connected to a respective bit line;
    a plurality of sense amplifiers, each said sense amplifier being connected to first and second pairs of bit lines through first and second pairs of transfer switches respectively;
    said respective first pair of bit lines being connected to input/output lines and said second pair of bit lines not being directly connected to input/output lines;
    refresh/read logic means coupled to said pairs of transfer swtiches and having a plurality of operating cycles comprising refresh cycles and read cycles, said logic means including means for generating control signals for controlling said pairs of transfer switches to thereby control connections between said bit-line pairs and said sense amplifiers;
    wherein:
        during said refresh cycles data may be rewritten into a memory cell connected to one of said bit-line pairs, and said control signal generating means generates control signals to control the connection of said one bit-line pair to said sense amplifier and a disconnection of the second bit-line pair from said sense amplifier throughout said refresh cycles; and
        during one of said read cycles data may be rewritten into a memory cell connected to one of said bit-line pairs, and said control signal generating means generates control signals to control the connection of said one bit-line pair to said sense amplifier, and the connection of said second bit-line pair tosaid sense amplifier after said one bit-line pair is connected to said sense amplifier; and
        during other of said read cycles data may be rewritten into a memory cell connected to the other of said bit-line pairs, and said control signal generating means generates control signals to control a disconnection of said one bit-line pair from said sense amplifier and the connection of the second bit-line pair to said sense amplifier throughout said other of said read cycles.

4. A dynamic random access semiconductor memory device comprising:
    a sense amplifier, and two pairs of bit lines sharing said sense amplifier, each pair of said bit lines having a plurality of memory cells connected thereto, and
    logic means for selecting a memory cell connected to one of said bit-line pairs, and disconnecting the memory cells connected to the other of said bit-line pairs from said sense amplifier, and wherein during a refresh cycle in which the selected memory cell is connected to one of said bit-line pairs, said bit lines of the other of said bit-line pairs remain disconnected from said sense amplifier.

5. A device according to claim 4, further comprising:
two pairs of transfer switches
respectively associated with said two pairs of bit lines
and selectively connecting and disconnecting the associated ones of said bit lines to and from said sense amplifier, and
control means, connected to receive a signal indicating a refresh cycle, for
turning OFF said transfer switches to disconnect said sense amplifier from said bit lines during amplification, and also
turning OFF said transfer switches associated with each pair of said bit lines when the ones of said memory cells connected to the other bit-line pair are selected during a refresh cycle.

6. A device according to claim 5,
wherein said sense amplifier comprises
first and second transistors
cross-coupled with each other to form a flip-flop circuit and
connected to receive a control signal for selectively enabling and disabling said sense amplifier, and
first and second sense nodes providing complementary outputs of said flip-flop circuit when said sense amplifier is enabled,
wherein said bit lines of each bit-line pair are connected through said associated transfer switches to said sense nodes.

7. A device according to claim 6,
wherein said first and second transistors of said sense amplifier comprise respective MOS transistors having their sources connected together and connected to receive said control signal for selectively enabling and disabling said sense amplifier,
and wherein each of said MOS transistors of said sense amplifier has its gate connected to the drain of the other said MOS transistor of said sense amplifier,
and wherein the drains of said MOS transistors of said sensen amplifier form said first and second sense nodes of said sense amplifier.

8. A device according to claim 6, further comprising
dummy memory cells each connected to a respective one of said bit lines,
said dummy memory cells providing a potential intermediate between the high and the low levels,
wherein when a memory cell connected to a bit line of one of said bit-line pairs is selected,
a dummy memory cell connected to the other bit line of said bit-line pair is also selected, and the potentials from the selected memory cell and the selected dummy memory cell are supplied to said sense amplifier.

9. A device according to claim 4, further comprising word selection means providing a selection signal to a memory cell connected to one of said bit-line pairs only when none of the other memory cells connected to the other said bit-line pair is also being provided a selection signal.

10. A dynamic random access semiconductor memory device comprising
two arrays of memory cells,
a row of shared sense amplifiers placed between and shared by said two arrays,
each array comprising pairs of bit lines, and memory cells controllably connected to said bit lines,
wherein each sense amplifier is shared by one of said bit-line pairs of one of said arrays and by one of said bit-line pairs of the other of said arrays, and
selection means for controlling connections of said memory cells to said bit lines,
said selection means being operated such that when one of said memory cells of one of said arrays is selected, said memory cells of the other said array are not selected,
and such that during a refresh cycle for rewriting data into a selected one of said memory cells of one of said arrays, said bit lines of the other said array are kept disconnected from said sense amplifier.

11. A device according to claim 10,
wherein each said array further comprises pairs of transfer switches associated with respective ones of said pairs of bit lines,
each said pair of transfer switches
coupling the associated one of said bit-line pairs to a respective one of said sense amplifiers,
and selectively connecting and disconnecting the associated one of said bit-line pairs to and from the respective one of said sense amplifiers,
and control means for
turning OFF said transfer switches to disconnect said sense amplifiers from one of said bit lines during amplification,
and also turning OFF said transfer switches of one of said arrays when said memory cells of the other array are selected during a refresh cycle.

12. A device according to claim 11,
wherein each said sense amplifier comprises first and second transistors
cross-coupled with each other to form a flip-flop circuit
and connected to receive a control signal for selectively enabling and disabling said sense amplifier,
and wherein said sense amplifier has first and second sense nodes providing complementary outputs of said flip-flop circuit when said sense amplifier is enabled, wherein said bit lines of each bit-line pair are connected through said associated transfer switches to said sense nodes of said sense amplifier.

13. A device according to claim 12,
wherein said first and second transistors of said sense amplifier comprise MOS transistors having their sources connected together and connected to receive said control signal,
and wherein each of said MOS transistors of said sense amplifier has its gate connected to the drain of the other said MOS transistor of said sense amplifier, the drains of said MOS transistors of said sense amplifier forming said first and second sense nodes of said sense amplifier.

14. A device according to claim 13, further comprising
dummy memory cells each connected to a respective one of said bit lines, said dummy memory cells providing a potential intermediate between the high and the low levels,
wherein when a memory cell connected to a bit line of one of said bit-line pairs is selected, one of said dummy memory cells connected to the other bit line of said bit-line pair is selected, and the potentials from said selected memory cell and said selected dummy memory cell are supplied to said sense amplifier.

15. A device according to claim 10, further comprising word selection means providing a selection signal to memory cells of one of said arrays only when none of said memory cells of the other said array are selected.

16. A dynamic random access semiconductor memory device, comprising:
   at least one array comprising a plurality of memory cells each connected to a respective bit line;
   a plurality of sense amplifiers, each said sense amplifier being connected to first and second pairs of bit lines through first and second respective pairs of pass transistors, each of said pairs of pass transistors having respective mutually connected gate lines;
   wherein, when a memory cell connected to said first bit line pair is selected during a refresh cycle, said second pass transistors are kept OFF, and when a memory cell connected to said second bit line pair is selected during a refresh cycle, said first pass transistors are kept OFF;
   and wherein, when a memory cell connected to said first bit line pair is selected during a read cycle, said second pass transistors are not necessarily kept OFF.

17. The memory of claim 16, wherein at least one of said first pair of bit lines is connected to input/output lines through a third respective pair of pass transistors.

18. The memory of claim 16, wherein at least one of said first pair of bit lines is connected to input/output lines through a third respective pair of pass transistors, and said respective first and third respective pairs of pass transistors are connected to opposite ends of said first pair of bit lines.

19. The memory of claim 16, wherein each of said memory cell comprises a storage capacitor connected to said respective bit line through a respective pass transistor.

20. A dynamic random access semiconductor memory device, comprising:
   at least one array comprising a plurality of memory cells each connected to a respective bit line;
   a plurality of sense amplifiers, each said sense amplifier being connected to first and second pairs of bit lines through first and second respective pairs of pass transistors, said respective first pair of bit lines being connected to input/output lines and said second pair of bit lines not being directly connected to input/output lines;
   wherein, when a memory cell connected to said first bit line pair is selected during a refresh cycle, said second pass transistors are kept OFF, and when a memory cell connected to said second bit line pair is selected during a refresh cycle, said first pass transistors are kept OFF;
   and wherein, when a memory cell connected to said first bit line pair is selected during a read cycle, said second pass transistors are not necessarily kept OFF.

21. The memory of claim 20, wherein at least one of said first pair of bit lines is connected to input/output lines through a third respective pair of pass transistors.

22. The memory of claim 20, wherein at least one of said first pair of bit lines is connected to input/output lines through a third respective pair of pass transistors, and said respective first and third respective pairs of pass transistors are connected to opposite ends of said first pair of bit lines.

23. The memory of claim 20, wherein each of said memory cell comprises a storage capacitor connected to said respective bit line through a respective pass transistor.

24. A dynamic random access semiconductor memory device, comprising:
   at least one array comprising a plurality of memory cells each connected to a respective bit line;
   a plurality of sense amplifiers, each said sense amplifier being connected to first and second pairs of bit lines through first and second respective pairs of pass transistors;
   wherein, when a memory cell connected to said first bit line pair is selected during a refresh cycle, said second pass transistors are kept OFF, and when a memory cell connected to said second bit line pair is selected during a refresh cycle, said first pass transistors are kept OFF;
   and wherein, when a memory cell connected to said second bit line pair is selected during a read cycle, said second pass transistors are turned ON, and said first pass transistors are turned ON after said second pass transistors are turned ON.

25. The memory of claim 24, wherein at least one of said first pair of bit lines is connected to input/output lines through a third respective pair of pass transistors.

26. The memory of claim 24, wherein at least one of said first pair of bit lines is connected to input/output lines through a third respective pair of pass transistors, and said respective first and third respective pairs of pass transistors are connected to opposite ends of said first pair of bit lines.

27. The memory of claim 24, wherein each of said memory cell comprises a storage capacitor connected to said respective bit line through a respective pass transistor.

28. A dynamic random access semiconductor memory device, comprising:
   at least one array comprising a plurality of memory cells each connected to a respective bit line;
   a plurality of sense amplifiers, each said sense amplifier being connected to first and second pairs of bit lines through first and second respective pairs of pass transistors, said respective first pair of bit lines being connected to input/output lines and said second pair of bit lines not being directly connected to input/output lines;
   wherein, when a memory cell connected to said first bit line pair is selected during a refresh cycle, said second pass transistors are kept OFF, and when a memory cell connected to said second bit line pair is selected during a refresh cycle, said first pass transistors are kept OFF;
   and wherein, when a memory cell connected to said second bit line pair is selected during a read cycle, said second pass transistors are turned ON, and said first pass transistors are turned ON after said second pass transistors are turned ON.

29. The memory of claim 28, wherein at least one of said first pair of bit lines is connected to input/output lines through a third respective pair of pass transistors.

30. The memory of claim 28, wherein at least one of said first pair of bit lines is connected to input/output lines through a third respective pair of pass transistors, and said respective first and third respective pairs of pass transistors are connected to opposite ends of said first pair of bit lines.

31. The memory of claim 28, wherein each of said memory cell comprises a storage capacitor connected to said respective bit line through a respective pass transistor.

32. A dynamic random access semiconductor memory device, comprising:
- at least one array comprising a plurality of memory cells each connected to a respective bit line;
- a plurality of sense amplifiers, each of said sense amplifiers being connected to right and left pairs of bit lines through first and second respective pairs of pass transistors;
- said respective pairs of pass transistors being controlled by logic which
  - turns ON ones of said first pass transistors if a memory cell connected to one of said right pairs of bit lines is selected, and
  - turns ON ones of said second pass transistors after said first transistors
    - if a memory cell connected to one of said right pairs of bit lines is selected
    - but only if a signal indicates that a refresh cycle is not active.

33. The memory of claim 32, wherein at least one of said first pair of bit lines is connected to input/output lines through a third respective pair of pass transistors.

34. The memory of claim 32, wherein at least one of said first pair of bit lines is connected to input/output lines through a third respective pair of pass transistors, and said respective first and third respective pairs of pass transistors are connected to opposite ends of said first pair of bit lines.

35. The memory of claim 32, wherein each of said memory cell comprises a storage capacitor connected to said respective bit line through a respective pass transistor.

36. A dynamic random access semiconductor memory device, comprising:
- at least one array comprising a plurality of memory cells each connected to a respective bit line; and
- a plurality of sense amplifiers, each said sense amplifier being connected to right and left pairs of bit lines through first and second respective pairs of pass transistors;
- said first pass transistors being selectively turned on by a signal which is logically dependent on the AND combination of
  - (1) the OR combination of
    - (a) one state of a right/left selection bit
    WITH
    - (b) a delayed signal based on the AND combination of
      - (i) the opposite state of said right/left selection bit
      WITH
      - (ii) a signal indicating that a refresh cycle is not in progress
    WITH
  - (2) a clock signal.

37. The memory of claim 36, wherein at least one of said first pair of bit lines is connected to input/output lines through a third respective pair of pass transistors.

38. The memory of claim 36, wherein at least one of said first pair of bit lines is connected to input/output lines through a third respective pair of pass transistors, and said respective first and third respective pairs of pass transistors are connected to opposite ends of said first pair of bit lines.

39. The memory of claim 36, wherein each of said memory cell comprises a storage capacitor connected to said respective bit line through a respective pass transistor.

40. A dynamic random access semiconductor memory device, comprising:
- a sense amplifier having a pair of sense nodes;
- a first pair of bit lines to which a plurality of memory cells are connected;
- a second pair of bit lines to which a plurality of memory cells are connected;
- a first pair of transfer gates for connecting said first pair of bit lines to said pair of sense nodes of said sense amplifier;
- a second pair of transfer gates for connecting said second pair of bit lines to said pair of sense nodes of said sense amplifier;
- a third pair of transfer gates for connecting said first pair of bit lines to a pair of I/O lines;
- a control means responsive to a clock signal for generating the timing for controlling said first and second pairs of transfer gates, a first selection signal for selecting a memory cell connected to said first pair of bit lines, a second selection signal for selecting a memory cell connected to said second pair of bit lines, and a signal for designating a refresh cycle, for controlling said first and second pairs of transfer gates such that:
  - during normal operation cycle, when a memory cell connected to said second pair of bit lines is selected, said second pair of transfer gates are made conductive to connect said second pair of bit lines to said sense nodes of said sense amplifier, and after said sense amplifier amplifies the potential differences between said second pair of bit lines, said first pair of transfer gates are made conductive to connect said first pair of bit lines to said sense nodes of said sense amplifier,
  - during a refresh cycle, when a memory cell connected to said first pair of bit lines is selected, said first pair of transfer gates are made conductive to connect said first pair of bit lines to said sense nodes of said sense amplifier, and said second pair of transfer gates are kept nonconductive to disconnect said second pair of bit lines from said sense nodes of said sense amplifier while the signal designating the refresh cycle is received, and when a memory cell connected to said second pair of bit lines is selected, said second pair of transfer gates are made conductive to connect said second pair of bit lines to said sense nodes of said sense amplifier, and said first pair of transfer gates are made nonconductive to disconnect said first pair of bit lines from said sense nodes of said sense amplifier while the signal designating the refresh cycle is received.

* * * * *